(12) United States Patent
Stroet et al.

(10) Patent No.: US 12,695,427 B2
(45) Date of Patent: Jul. 28, 2026

(54) INTERCEPT-TEMPERATURE DRIFT CALIBRATION OF A SIGNAL STRENGTH DETECTOR

(71) Applicant: Analog Devices, Inc., Wilmington, MA (US)

(72) Inventors: Petrus M. Stroet, Santa Cruz, CA (US); Daniel J. Linebarger, Los Gatos, CA (US); John P. Myers, Fremont, CA (US); Michael Hendrikus Laurentius Kouwenhoven, Morgan Hill, CA (US)

(73) Assignee: Analog Devices, Inc., Wilmington, MA (US)

( * ) Notice: Subject to any disclaimer, the term of this patent is extended or adjusted under 35 U.S.C. 154(b) by 69 days.

(21) Appl. No.: 18/581,893

(22) Filed: Feb. 20, 2024

(65) Prior Publication Data

US 2024/0280615 A1     Aug. 22, 2024

Related U.S. Application Data

(60) Provisional application No. 63/486,116, filed on Feb. 21, 2023, provisional application No. 63/486,109, filed on Feb. 21, 2023.

(51) Int. Cl.
    *H03F 1/30*        (2006.01)
    *G01R 19/32*     (2006.01)
    (Continued)

(52) U.S. Cl.
    CPC .............. *H03F 1/302* (2013.01); *G01R 19/32* (2013.01); *G01R 35/005* (2013.01);
    (Continued)

(58) Field of Classification Search
    CPC ................. H03F 1/302; H03F 3/45085; H03F 2200/261; H03F 2200/462; G01R 19/32;
    (Continued)

(56) References Cited

U.S. PATENT DOCUMENTS

| | | |
|---|---|---|
| 4,604,532 A | 8/1986 | Gilbert |
| 8,004,341 B1 | 8/2011 | Gilbert |

(Continued)

FOREIGN PATENT DOCUMENTS

| | | |
|---|---|---|
| JP | 2014 060484 A | 4/2014 |

OTHER PUBLICATIONS

Nash et al, "An Integrated Solution for 1-15 Direct Detection and Control of RF Transmitters," RF Design, Primedia Business Magazines & Media, Overland Park, KS, US, vol. 22, No. 6, Jun. 1, 1999 (Jun. 1, 1999).

(Continued)

*Primary Examiner* — Akm Zakaria
(74) *Attorney, Agent, or Firm* — Knobbe, Martens, Olson & Bear, LLP

(57) ABSTRACT

A device may include an intercept-temperature drift input to receive an intercept-temperature drift value. The device may further include a reference current generator that generates a reference current based at least in part on the intercept-temperature drift value. Additionally, the device may include an analog signal chain that adjusts a slope-temperature drift of the signal-strength detector by adjusting a delta proportional to absolute temperature of the analog signal chain.

19 Claims, 7 Drawing Sheets

(51) Int. Cl.
| | |
|---|---|
| *G01R 35/00* | (2006.01) |
| *H03F 3/45* | (2006.01) |
| *H03M 1/72* | (2006.01) |

(52) U.S. Cl.
CPC .......... *H03F 3/45085* (2013.01); *H03M 1/72* (2013.01); *H03F 2200/261* (2013.01); *H03F 2200/462* (2013.01)

(58) Field of Classification Search
CPC ........ G01R 35/005; G01R 15/22; G01R 1/44; G01R 35/00; H03M 1/72
See application file for complete search history.

(56) References Cited

U.S. PATENT DOCUMENTS

| | | | | | |
|---|---|---|---|---|---|
| 8,207,776 | B1 | 6/2012 | Gilbert | | |
| 10,852,329 | B2 * | 12/2020 | Fernandez | .......... | H03F 3/45475 |
| 2006/0110169 | A1 * | 5/2006 | Reintjes | ............. | H01S 5/06832 |
| | | | | | 398/195 |

| | | | | | |
|---|---|---|---|---|---|
| 2006/0202821 | A1 * | 9/2006 | Cohen | ................ | G06K 19/0723 |
| | | | | | 73/146 |
| 2011/0057718 | A1 * | 3/2011 | Snoeij | ........................ | H03F 1/30 |
| | | | | | 327/512 |
| 2016/0018839 | A1 | 1/2016 | Cocetta | | |
| 2016/0098048 | A1 | 4/2016 | Sharma et al. | | |
| 2016/0211031 | A1 | 7/2016 | Taigor et al. | | |
| 2019/0033907 | A1 * | 1/2019 | Raghavan | ................. | G05F 5/00 |
| 2023/0152216 | A1 * | 5/2023 | Mortada | ............. | G01N 21/274 |
| | | | | | 356/326 |
| 2023/0324940 | A1 * | 10/2023 | Singh | ...................... | G05F 1/575 |
| | | | | | 323/280 |
| 2023/0409066 | A1 | 12/2023 | Stroet | | |
| 2025/0180473 | A1 * | 6/2025 | Schmidt | ................... | G01J 1/44 |

OTHER PUBLICATIONS

Extended European Search Report in EP 24156234.7 dated Jul. 8, 2024.

* cited by examiner

INTERCEPT-TEMPERATURE DRIFT CALIBRATION OF A SIGNAL STRENGTH DETECTOR

INCORPORATION BY REFERENCE

This application claims priority to U.S. Provisional Application No. 63/486,109, filed Feb. 21, 2023 and U.S. Provisional Application No. 63/486,116, filed Feb. 21, 2023, the disclosures of each of which are hereby incorporated by reference herein in its entirety for all purposes and made a part of the present specification. Further, this application incorporates by reference in its entirety for all purposes and makes a part of the present specification International Application No. PCT/US2021/072629. In addition, this application is filed on the same date, Feb. 20, 2024, as U.S. application Ser. No. 18/581,919, which is titled "SLOPE-TEMPERATURE DRIFT CALIBRATION OF A SIGNAL STRENGTH DETECTOR," the disclosure of which is hereby incorporated by reference herein in its entirety for all purposes and made a part of the present specification. Any and all applications for which a foreign or domestic priority claim is identified in the Application Data Sheet as filed with the present application are hereby incorporated by reference under 37 CFR 1.57.

FIELD OF THE DISCLOSURE

Embodiments of the present disclosure relate to electronic systems, and more particularly to, a trim algorithm that reduces part-to-part temperature drift for signal strength detectors.

BACKGROUND

Operation of some electronic devices may be impacted by temperature variations. Part-to-part variations due, for example, to manufacturing tolerances and impedance mismatches between circuit elements may cause divergent behavior among two instances of an electronic device. One example of an electronic device that can suffer from divergent operation due to temperature is a signal strength detector.

SUMMARY OF THE DISCLOSURE

The systems, methods and devices of this disclosure each have several innovative aspects, no single one of which is solely responsible for all of the desirable attributes disclosed herein. Details of one or more implementations of the subject matter described in this specification are set forth in the accompanying drawings and the description below.

In some aspects, the techniques described herein relate to a signal-strength detector including: an intercept-temperature drift input to receive an intercept-temperature drift value; a reference current generator that generates a reference current based at least in part on the intercept-temperature drift value; and an analog signal chain that adjusts an intercept-temperature drift of the signal-strength detector based at least in part on the reference current.

In some aspects, the techniques described herein relate to a signal-strength detector, wherein the reference current includes a trim value determined based at least in part on the intercept-temperature drift value, wherein inclusion of the trim value with the reference current causes adjustment of the intercept-temperature drift of the signal-strength detector.

In some aspects, the techniques described herein relate to a signal-strength detector, wherein the reference current generator generates the reference current as a weighted sum of a proportional to absolute temperature (PTAT) current and a complementary to absolute temperature (CTAT) current.

In some aspects, the techniques described herein relate to a signal-strength detector, wherein adjusting a ratio of the PTAT current to the CTAT current adjusts the intercept-temperature drift of the signal-strength detector.

In some aspects, the techniques described herein relate to a signal-strength detector, wherein the analog signal chain includes the reference current generator.

In some aspects, the techniques described herein relate to a signal-strength detector, wherein the reference current generator includes a first current digital to analog converter (IDAC) configured to weight a PTAT current and a second IDAC configured to weight a CTAT current.

In some aspects, the techniques described herein relate to a signal-strength detector, wherein a sum of the weighted PTAT current and the weighted CTAT current provides a fine adjustment of the reference current, and wherein the reference current generator further includes a third IDAC that provides a coarse adjustment of the reference current.

In some aspects, the techniques described herein relate to a signal-strength detector, further including a resistive heater configured to apply heat to the analog signal chain.

In some aspects, the techniques described herein relate to a signal-strength detector, wherein the resistive heater is configured to support an OFF state and a plurality of ON states, wherein each ON state of the plurality of ON states causes a different amount of heat to be applied to the analog signal chain.

In some aspects, the techniques described herein relate to a signal-strength detector, wherein the intercept-temperature drift value is determined based at least in part on a plurality of output values of the signal-strength detector obtained for an input current at a plurality of temperature values and a plurality of reference current values.

In some aspects, the techniques described herein relate to a signal-strength detector, wherein the resistive heater applies different amounts of heat to the analog signal chain to obtain the plurality of temperature values.

In some aspects, the techniques described herein relate to a signal-strength detector, wherein the intercept-temperature drift value is determined using regression analysis on the plurality of output values of the signal-strength detector obtained for the input current at the plurality of temperature values and the plurality of reference current values.

In some aspects, the techniques described herein relate to a signal-strength detector, further including a non-volatile memory configured to store the intercept-temperature drift value, and wherein the reference current generator accesses the intercept-temperature drift value from the non-volatile memory.

In some aspects, the techniques described herein relate to a signal-strength detector, further including an interface circuit configured to receive the intercept-temperature drift value from the intercept-temperature drift input and to store the intercept-temperature drift value at a non-volatile memory.

In some aspects, the techniques described herein relate to a signal-strength detector, further including an analog temperature compensation circuit that adjusts a slope-temperature drift of the signal-strength detector by at least adding a PTAT current to a zero to absolute temperature (ZTAT) current.

In some aspects, the techniques described herein relate to a signal-strength detector, wherein the analog temperature compensation circuit is connected in series with the analog signal chain, and wherein the analog temperature compensation circuit generates an output of the signal-strength detector corresponding to a measured signal strength of an input signal.

In some aspects, the techniques described herein relate to a signal-strength detector, wherein the PTAT current is a trim current that is added to the ZTAT current and to a second PTAT current.

In some aspects, the techniques described herein relate to a signal-strength detector, wherein the PTAT current is determined using regression analysis on a plurality of slope-temperature drift values at a plurality of temperatures applied by a resistive heater of the signal-strength detector.

In some aspects, the techniques described herein relate to a photocurrent detection system including: a photocurrent detector configured to receive a photocurrent output by a photodiode; and a signal-strength detector configured to measure a signal strength of the photocurrent output, wherein the signal-strength detector includes: an intercept-temperature drift input to receive an intercept-temperature drift value; a reference current generator that generates a reference current based at least in part on the intercept-temperature drift value; and an analog signal chain that adjusts an intercept-temperature drift of the signal-strength detector based at least in part on the reference current.

In some aspects, the techniques described herein relate to a method of calibrating a signal-strength detector, the method including: causing a resistive heater of the signal-strength detector to be in an OFF state; for an input current value corresponding to a photocurrent of a photodetector and when the resistive heater is in the OFF state, sweeping a slope-temperature drift of an output value of the signal-strength detector generated based on the input current value among a range of slope-temperature drift values; and for each slope-temperature drift value of the range of slope-temperature drift values, sweeping a reference current value among a range of reference current values to obtain a first set of intercept values; causing the resistive heater to be in an ON state, wherein the resistive heater heats at least an analog signal chain of the signal-strength detector when in the ON state; for the input current value corresponding to the photocurrent of the photodetector and when the resistive heater is in the ON state, sweeping the slope-temperature drift of the output value of the signal-strength detector generated based on the input current value among the range of slope-temperature drift values; and for each slope-temperature drift value of the range of slope-temperature drift values, sweeping the reference current value among the range of reference current values to obtain a second set of intercept values; using the first set of intercept values and the second set of intercept values, performing linear regression to determine an intercept-temperature drift control value that minimizes intercept-temperature drift of the signal-strength detector; and configuring a register value of the signal-strength detector with the intercept-temperature drift control value, wherein the signal-strength detector sets the reference current value based at least in part on the intercept-temperature drift control value during operation.

In some aspects, the techniques described herein relate to a signal-strength detector including: a slope-temperature drift input to receive a slope-temperature drift value; a proportional to absolute temperature (PTAT) current generator that generates a delta PTAT current based at least in part on the slope-temperature drift value; and an analog temperature compensation circuit that adjusts a slope-temperature drift of the signal-strength detector based at least in part on the delta PTAT current.

In some aspects, the techniques described herein relate to a signal-strength detector, wherein the PTAT current generator is further configured to generate a PTAT current.

In some aspects, the techniques described herein relate to a signal-strength detector, wherein a magnitude of the delta PTAT current is a fraction of a magnitude of the PTAT current.

In some aspects, the techniques described herein relate to a signal-strength detector, wherein the magnitude of the delta PTAT current is 10% or less than the magnitude of the PTAT current.

In some aspects, the techniques described herein relate to a signal-strength detector, wherein the analog temperature compensation circuit is configured to add the delta PTAT current to the PTAT current.

In some aspects, the techniques described herein relate to a signal-strength detector, wherein the analog temperature compensation circuit is configured to adjust the slope-temperature drift of the signal-strength detector by adding the delta PTAT current to a zero to absolute temperature (ZTAT) current of the analog temperature compensation circuit.

In some aspects, the techniques described herein relate to a signal-strength detector, further including a resistive heater configured to apply heat to the analog temperature compensation circuit.

In some aspects, the techniques described herein relate to a signal-strength detector, wherein the resistive heater is configured to support an OFF state and a plurality of ON states, wherein each ON state of the plurality of ON states causes a different amount of heat to be applied to the analog temperature compensation circuit.

In some aspects, the techniques described herein relate to a signal-strength detector, wherein the slope-temperature drift value is determined based at least in part on a plurality of output values of the signal-strength detector obtained for an input current at a plurality of temperature values and a plurality of slope-temperature drifts values.

In some aspects, the techniques described herein relate to a signal-strength detector, wherein the resistive heater applies different amounts of heat to the analog temperature compensation circuit to obtain the plurality of temperature values.

In some aspects, the techniques described herein relate to a signal-strength detector, wherein the slope-temperature drift value is determined using regression analysis on the plurality of output values of the signal-strength detector obtained for the input current at the plurality of temperature values and the plurality of slope-temperature drifts values.

In some aspects, the techniques described herein relate to a signal-strength detector, further including a non-volatile memory configured to store the slope-temperature drift value, and wherein the PTAT current generator accesses the slope-temperature drift value from the non-volatile memory.

In some aspects, the techniques described herein relate to a signal-strength detector, further including an interface circuit configured to receive the slope-temperature drift value from the slope-temperature drift input and to store the slope-temperature drift value at a non-volatile memory.

In some aspects, the techniques described herein relate to a signal-strength detector, wherein the analog temperature compensation circuit includes the PTAT current generator.

In some aspects, the techniques described herein relate to a signal-strength detector, further including an analog signal chain that adjusts an intercept-temperature drift of the signal-strength detector based at least in part on a reference current generated by a reference current generator of the analog signal chain.

In some aspects, the techniques described herein relate to a signal-strength detector, wherein the analog signal chain is connected in series with the analog temperature compensation circuit, and wherein the analog signal chain provides a level-shifted voltage as an input to the analog temperature compensation circuit.

In some aspects, the techniques described herein relate to a signal-strength detector, wherein the level-shifted voltage corresponds to a photocurrent generated by a photodiode and input to the signal-strength detector.

In some aspects, the techniques described herein relate to a signal-strength detector, wherein the reference current is determined using regression analysis on a plurality of output values of the signal-strength detector obtained for an input value at a plurality of temperatures applied by a resistive heater of the signal-strength detector.

In some aspects, the techniques described herein relate to a photocurrent detection system including: a photocurrent detector configured to receive a photocurrent output by a photodiode; and a signal-strength detector configured to measure a signal strength of the photocurrent output, wherein the signal-strength detector includes: a slope-temperature drift input to receive a slope-temperature drift value; a proportional to absolute temperature (PTAT) current generator that generates a delta PTAT current based at least in part on the slope-temperature drift value; and an analog temperature compensation circuit that adjusts a slope-temperature drift of the signal-strength detector based at least in part on the delta PTAT current.

In some aspects, the techniques described herein relate to a method of calibrating a signal-strength detector, the method including: causing a resistive heater of the signal-strength detector to be in an OFF state; for an input current value corresponding to a photocurrent of a photodetector and when the resistive heater is in the OFF state, sweeping a slope-temperature drift of an output value of the signal-strength detector generated based on the input current value among a range of slope-temperature drift values; and for each slope-temperature drift value of the range of slope-temperature drift values, sweeping a reference current value among a range of reference current values to obtain a first set of values; causing the resistive heater to be in an ON state, wherein the resistive heater heats at least an analog signal chain of the signal-strength detector when in the ON state; for the input current value corresponding to the photocurrent of the photodetector when the resistive heater is in the ON state, sweeping the slope-temperature drift of the output value of the signal-strength detector generated based on the input current value among the range of slope-temperature drift values; and for each slope-temperature drift value of the range of slope-temperature drift values, sweeping the reference current value among the range of reference current values to obtain a second set of values; using linear regression, determining where the first set of values and the second set of values intersect to determine a slope-temperature drift control value that minimizes slope-temperature drift of the signal-strength detector; and configuring a register value of the signal-strength detector with the slope-temperature drift control value, wherein the signal-strength detector sets a delta proportional to absolute temperature (PTAT) current based at least in part on the slope-temperature drift control value during operation.

Although certain embodiments and examples are disclosed herein, inventive subject matter extends beyond the examples in the specifically disclosed embodiments to other alternative embodiments and/or uses, and to modifications and equivalents thereof.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure. In addition, various features of different disclosed embodiments can be combined to form additional embodiments, which are part of this disclosure. Further, one or more features or structures can be removed or omitted.

DETAILED DESCRIPTION

The headings provided herein, if any, are for convenience only and do not necessarily affect the scope or meaning of the claimed embodiments. The following detailed description of embodiments presents various descriptions of specific embodiments of the invention. However, the invention can be embodied in a multitude of different ways. In this description, reference is made to drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Introduction

Apparatus and methods for signal strength detection are disclosed herein. A signal strength detector may be used in a number of different applications where it may be desirable to determine a strength of a particular signal. For example, a signal strength detector may be used to measure a signal strength of a current generated by a photodetector or a photodiode. The present disclosure is not limited by the use of the signal strength detector or the type of signal that may be measured by the signal strength detector.

The output and/or accuracy of signal strength detectors may vary based on a number of factors including, for example, temperature, component mismatches, trimming resolution, and the like. The signal strength detector may be any type of signal strength detector. In some cases, the signal strength detector may be a logarithmic power detection circuit.

Figure 1:
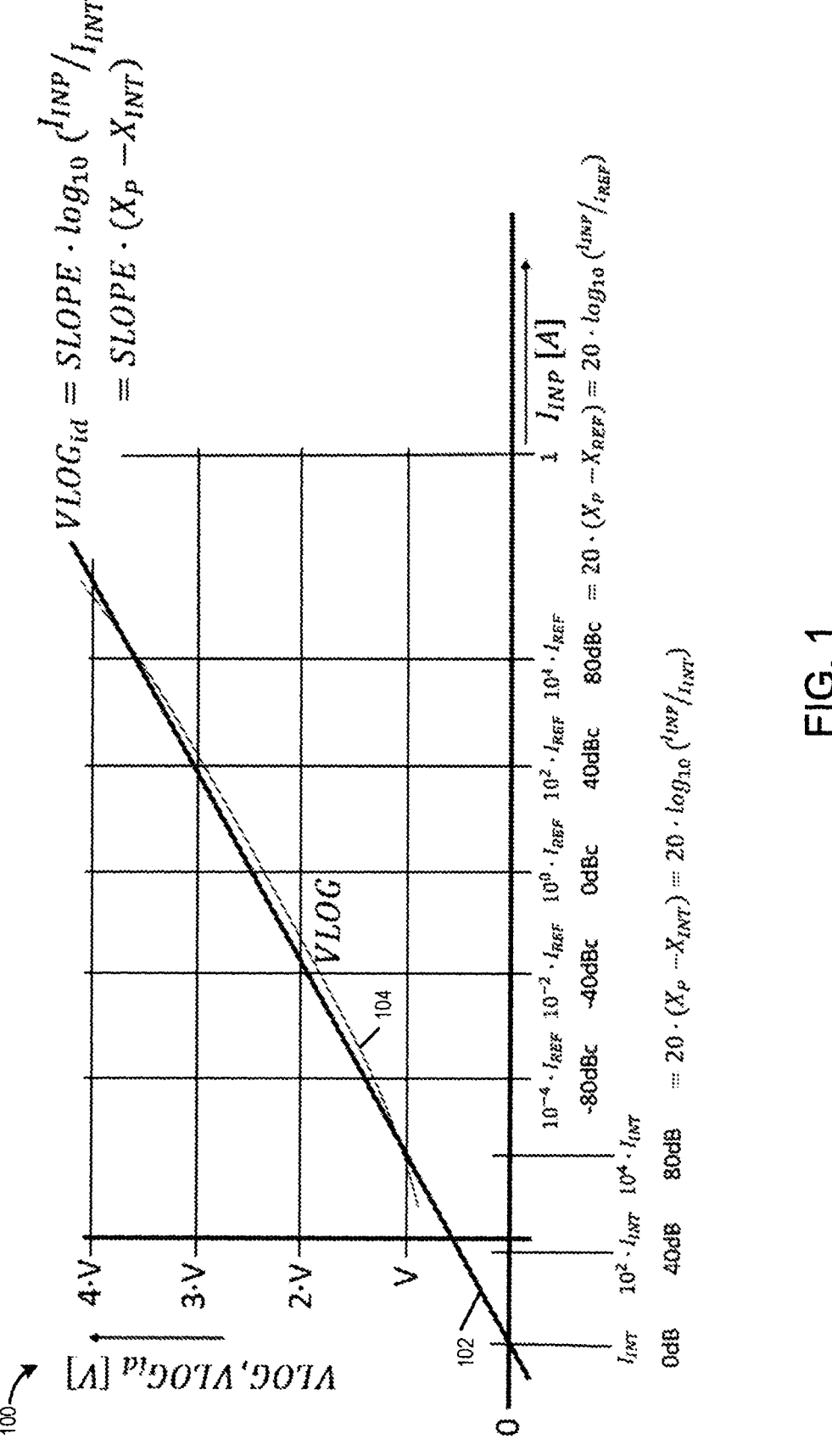
FIG. 1 illustrates a graph of an input to output relationship of a logarithmic current detection circuit.

FIG. 1 illustrates a graph 100 of an input to output relationship of a logarithmic power detection circuit. The X-axis of the graph 100 illustrates input current on a logarithmic scale for a current signal being measured by a signal strength detector. The Y-axis of the graph 100 illustrates the measured signal strength, labelled as VLOG, for the measured current signal. The line 102 represent the ideal curve for the signal strength detector. The line 104 represents an example of a real curve of an output of a signal detector verses an input current on a logarithmic scale. Each signal detector may generate different outputs based on the previously identified factors, among others.

It is desirable to reduce inconsistency in signal strength detectors. Further, it is desirable to calibrate or trim the output curve generated by the signal strength detector to be as close to the ideal as possible to generate a more accurate measurement. It is also desirable to maintain the output curve over different operating temperatures because although calibrating the output curve in a final application or device that incorporates the signal strength detector is sometimes possible, it is often not possible to do so for different application temperatures. In some cases, a signal strength detector can be calibrated during a manufacturing process to account for signal strength measurement inconsistencies due to varying operating temperatures by using, for example, an oven or a hot chuck to test the signal strength detector circuit at different temperatures. However, use of an oven or hot chuck can be time consuming and costly due, for example, to use of a two-pass test method during testing, and particularly when manufacturing a large number of signal strength detectors or products that incorporate the signal strength detector.

A signal strength detector that incorporates an on-chip heater, such as a resistive heater, can be calibrated without using an oven or hot chuck. Advantageously, the on-chip heater enables calibration of the signal strength detector at multiple temperatures without an oven or hot chuck, which enables cheaper and faster calibration. Further, in some cases, calibration may be more accurate. Moreover, the use of the on-chip heater enables identification of faulty signal strength detectors that may not be identified using a one-pass test method.

In addition to the on-chip heater, the signal strength detector may include a programmable analog signal chain and a programmable analog temperature compensation circuit that enables calibration of the signal strength detector to more accurately measure signal strength across a range of temperatures. A linear regression calculation may be performed across a range of slope-temperature drift values and intercept-temperature drift values for a range of temperatures to determine optimal calibration settings for the signal strength detector to compensate for temperature drift. The linear regression calculation may be a matrix calculation performed across the range of aforementioned values. Further, determined calibration values that are outliers (e.g., that indicate calibration values that are, for example, more than a certain amount of standard deviations (for example: 3 standard deviations) from the norm or average calibration value) may indicate faulty signal strength detectors.

Example Signal Strength Detector

Figure 2:
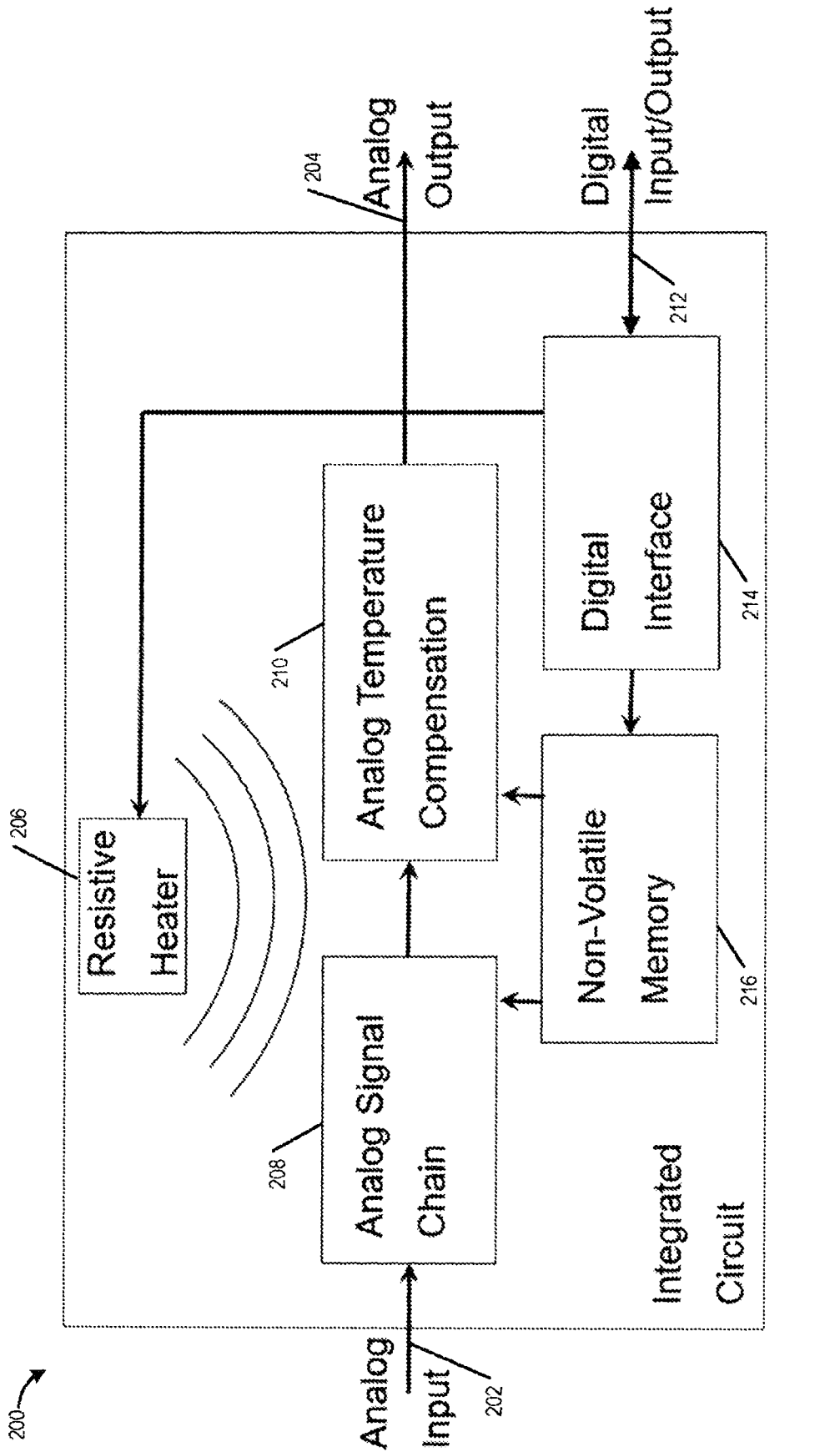
FIG. 2 illustrates a block diagram of a signal strength detector in accordance with certain embodiments.

FIG. 2 illustrates a block diagram of a signal-strength detector 200 in accordance with certain embodiments. The signal-strength detector 200 may be configured to measure the signal strength of a received current or a current generated in response to a signal to be measured. The signal to be measured may be a photocurrent received from a photodiode or any other type of signal that may be measured by a signal strength detector. The signal may be received at the input 202 (or input port, input pin, or input connection, etc.) of the signal-strength detector 200. Thus, in some cases, a photodiode may be positioned or connected directly or indirectly to the input 202. Alternatively, a photocurrent detector may be connected to the input 202 and may be configured to receive a photocurrent output from a photodiode.

The signal-strength detector 200 may generate an output signal based at least in part on the signal revived at the input 202. This output signal may correspond to a strength of the received signal received at the input 202. The output signal may be output at the output 204 (or output port, output pin, output connection, etc.). In some cases, the output signal may be a voltage, which may be referred to as VLOG.

The signal-strength detector 200 may include an analog signal chain 208 and an analog temperature compensation circuit 210. The analog signal chain 208 may adjust an intercept-temperature drift of the signal-strength detector 200 based at least in part on a reference current. The reference current may be determined during a calibration process and is specific to the particular instance of the signal-strength detector 200. Further, the reference current may be generated by a reference current generator of the analog signal chain 208. As explained further below, the reference current generator may include a trim value that adjusts the reference current supplied to the analog signal chain 208 to account for intercept and intercept-temperature drift deviations.

The analog temperature compensation circuit 210 may adjust a slope-temperature drift of the signal-strength detector 200 based at least in part on a slope trim value. This slope trim value may be a small proportional to absolute temperature (PTAT) current value and may be referred to as a delta PTAT current value. The delta PTAT current may be a fraction of a PTAT current applied to the analog temperature compensation circuit 210 and may be used to adjust the slope-temperature drift of the signal-strength detector 200.

The signal-strength detector 200 may further include a heater, such as a resistive heater 206. In some cases, the signal-strength detector 200 may include other types of heaters. The resistive heater 206 may be used to calibrate the signal-strength detector 200 by applying one or more levels of heat to the analog signal chain 208 and analog temperature compensation circuit 210 to obtain output measurements relative to an input at different temperatures. In some cases, measurements may be obtained when the resistive heater 206 is in an OFF state and measurements may be obtained when the resistive heater 206 is in an ON state. The resistive heater 206 may apply heat to the analog signal chain 208 and analog temperature compensation circuit 210 when in the ON state. In some cases, the resistive heater 206 may be configured to apply different levels of heat when in the ON state. Measurements may be obtained for each of the different levels of applied heat when in the ON state.

The resistive heater 206 may be controlled by interacting with an interface. For example, the resistive heater 206 may be controlled by supplying a control input to the IO pin 212 or by interacting with the interface 214. In some cases, the resistive heater 206 may be controlled by a separate control interface (not shown).

The signal-strength detector 200 may further include an interface circuit or an interface 214, which may be a digital interface or otherwise. The interface 214 may receive an input or transmit an output via an input/output pin (IO pin 212). The IO pin 212 (or IO port or IO connection, etc.) may be a digital I/O or otherwise. The IO pin 212 may be a single input configured to supply one or more values to the interface 214. Further, the IO pin 212 may be a plurality of pins that can receive a multi-bit input or multiple bytes of input. Alternatively, the IO pin 212 may include multiple input pins, ports, or connections with each input configured to receive different input values associated with different registers or types of data. In some cases, the IO pin 212 may serve as an intercept-temperature drift input configured to receive an intercept-temperature drift value. Additionally, or alternatively, the IO pin 212 may serve as a slope-temperature drift input configured to receive a slope-temperature drift value. Further, the IO pin 212 may be used to access one or more configuration values (e.g., an intercept-temperature drift value, a slope-temperature drift value, a resistive heater 206 state, etc.) to determine a configuration of the signal-strength detector 200.

The interface 214 may be configured to store the one or more configuration values at a non-volatile memory 216 of the signal-strength detector 200. Further, the interface 214 may be configured to access the one or more configuration values from the non-volatile memory 216. Advantageously, by storing one or more configuration values at the non-volatile memory 216, the signal-strength detector 200 may be configured with specific configuration values for a specific instance of the signal-strength detector 200 enabling the signal-strength detector 200 to be calibrated as part of a manufacturing process to account for differences due, for example, to manufacturing tolerances, manufacturing processes, impedance mismatches, or any other factor that may cause two instances of the signal-strength detector 200 to generate differing results for an input at a particular temperature.

The non-volatile memory 216 may include any type of memory that can store configuration values and/or provide access to the configuration values. In some cases, the non-volatile memory 216 may include a register, a solid-state memory, a flash memory, read-only memory, etc.

The analog signal chain 208 and the analog temperature compensation circuit 210 may each be calibrated based on the one or more configuration values stored in the non-volatile memory 216. Further, the analog signal chain 208 and the analog temperature compensation circuit 210 may each be calibrated based at least in part on calibration values determined during a manufacturing process using the on-chip resistive heater 206 enabling simplified and cheaper calibration compared to other processes that do not have access to an on-chip resistive heater 206. The analog signal chain 208 and the analog temperature compensation circuit 210 are described in more detail herein.

The signal-strength detector 200 may be used in any type of system that may include one or more operations that rely on signal strength. For example, the signal-strength detector 200 may be included in a photocurrent detection system. The photocurrent detection system may include a photocurrent detector configured to receive a photocurrent output by a photodiode. The photocurrent output may be supplied to the signal-strength detector 200 at the input 202 so that the signal-strength detector 200 can measure the signal strength of the photocurrent.

Example Analog Signal Chain

Figure 3:
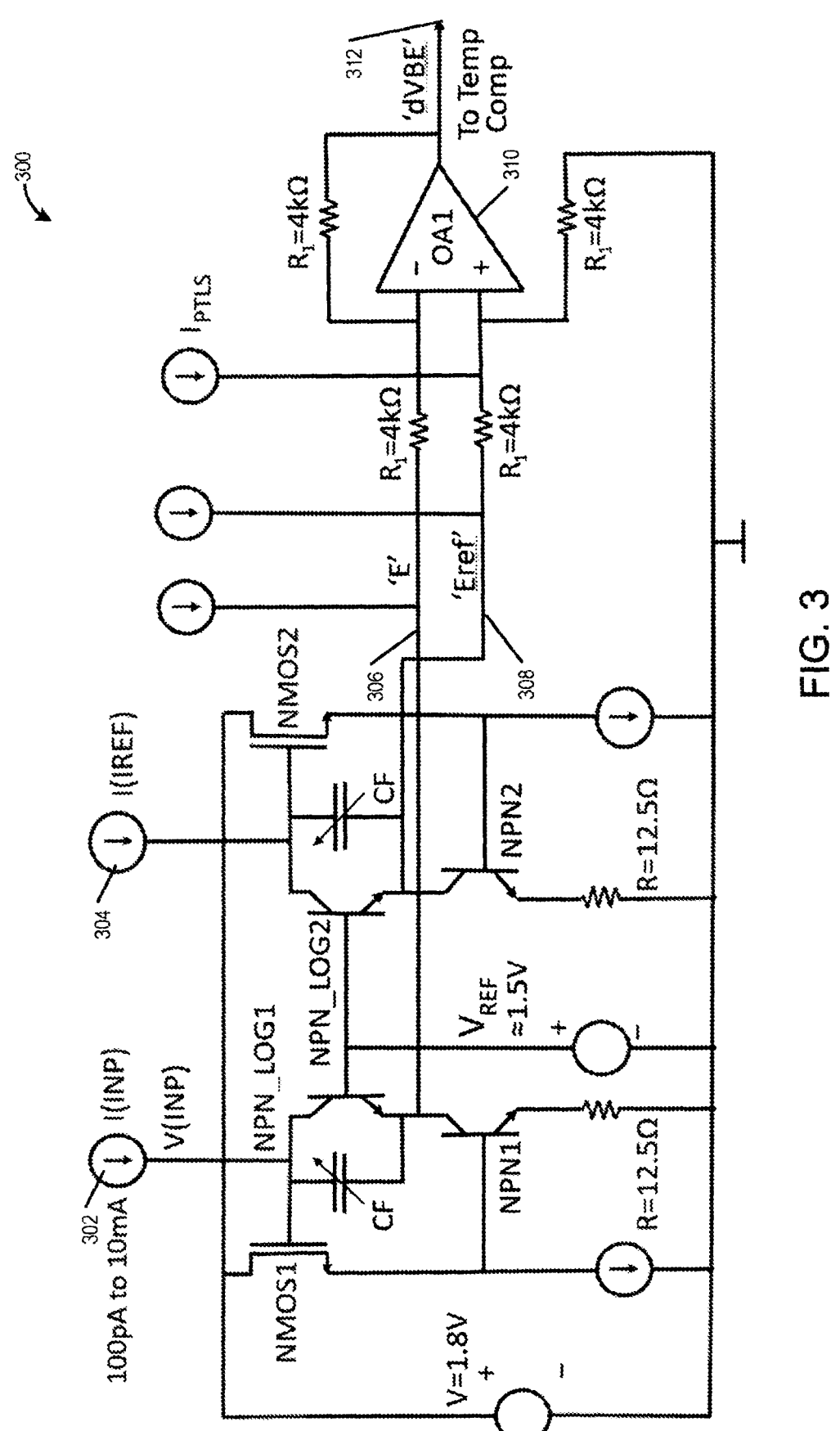
FIG. 3 illustrates a circuit diagram of a single-ended logarithmic current-to-voltage converter with a level shifter in accordance with certain embodiments.

FIG. 3 illustrates a circuit diagram of a single-ended logarithmic current-to-voltage converter with a level shifter in accordance with certain embodiments. The current-to-voltage converter 300 of FIG. 3 forms a portion of the analog signal chain 208. The current-to-voltage converter 300 includes two inputs. The first input, input 302, corresponds to the input 202. The input 302 receives the signal to be measured by the signal-strength detector 200 and can be any type of signal to be measured, such as a photocurrent signal received from a photodiode. The range of the input may be anywhere from 100 picoamps to 10 milliamps. However, the present disclosure is not limited as such, and an input signal of lesser or greater amps may be received by the signal-strength detector 200 at the input 302.

The second input is the reference current input 304, which supplies a reference current to the current-to-voltage converter 300. This reference current may be generated by a reference current generator, which is disclosed in more detail herein. The current-to-voltage converter 300 may be responsive to a difference voltage between the 'E' signal 306, which is generated based on the signal to be measured that is received at the input 302, and the 'Eref' signal 308, which is generated based on the reference signal generated by the reference current generator and received at the reference current input 304. The difference voltage amplification is performed by an operational amplifier or OpAmp 310. The output of the OpAmp 310, which may be referred to as the 'dVBE' signal, is output by the output node 312 and is supplied as an input to the analog temperature compensation circuit 210.

Additional embodiments of logarithmic current-to-voltage converters that may be used to implement the current-to-voltage converter 300 are described in International Application No. PCT/US2021/072629, which is hereby incorporated by reference herein in its entirety for all purposes and made a part of the present disclosure.

The reference current supplied at the reference current input 304 may be calibrated for an individual instance of the signal-strength detector 200 to adjust the intercept-temperature drift for the specific instance of the signal-strength detector 200. Different signal strength detectors may be calibrated to generate different reference currents based at least in part on the different intercept-temperature drifts for each of the signal strength detectors. Calibrating the signal-strength detector 200 to change the temperature adjustable reference current generated enables adjustment of the intercept-temperature drift. The reference current may be determined during a calibration process by performing regression analysis (e.g., using a matrix calculation) of a plurality of reference currents, corresponding to a plurality of intercept-temperature drifts, and a plurality of slope-temperature drifts at a plurality of temperatures of the signal-strength detector 200 as set by controlling the resistive heater 206. A known input value may be supplied to the input 302 to obtain an output value at the output 204. Based at least on the supplied input value, the measured output value, and the different configurations set for generating the reference currents, the regression analysis can determine the optimal reference current for setting the desired intercept-temperature drift or trim value.

Example Reference Current Generator

Figure 4:
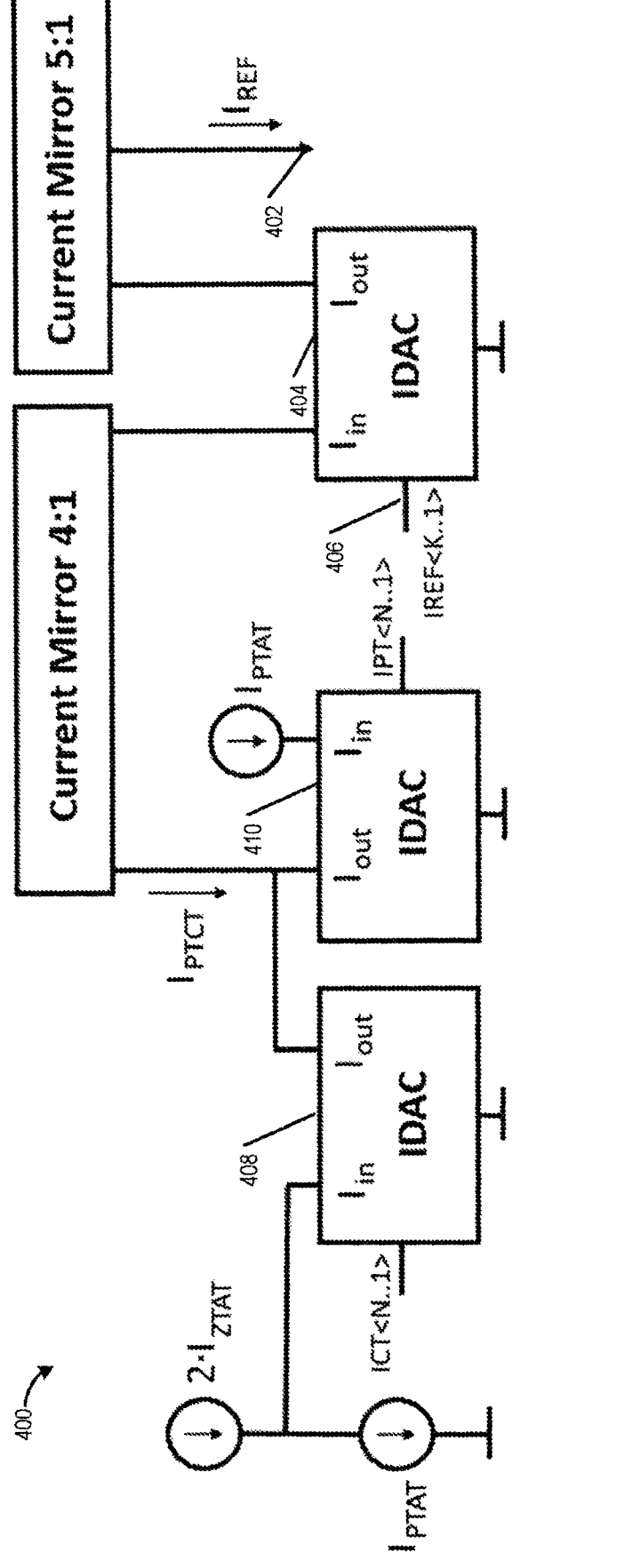
FIG. 4 illustrates a circuit diagram of a reference current generator in accordance with certain embodiments.

FIG. 4 illustrates a circuit diagram of a reference current generator 400 in accordance with certain embodiments. The reference current generator 400 in combination with the current-to-voltage converter 300 may form the analog signal chain 208. The reference current generator 400 may generate a reference current, which may be output by the reference current output 402. The reference current may be supplied as an input to the current-to-voltage converter 300 and may be modified to trim or adjust the intercept-temperature drift for the signal-strength detector 200.

The reference current generator 400 may include three current digital-to-analog converters (IDACs). The IDAC 404 may be configured to perform a coarse adjustment of the reference current generated by the reference current generator 400. The IDAC 404 may adjust the reference current based on a reference current control value, IREF (or IREF<K . . . 1>), supplied to the IDAC 404 at the control input 406. The coarse adjustment may be on the order of 1 dB. In other words, the smallest adjustment of the reference current using the IDAC 404 may be 1 dB. It should be understood that the IDAC 404 may be configured to adjust the reference current by other granularities. In some implementations, the illustrated IDAC 404 is a 4-bit DAC. Thus, the reference current control value may be IREF<4 . . . 1>. However, it is possible for the IDAC 404 to have more or less bits.

The IDAC 408 and the IDAC 410 may in combination perform a more granular adjustment of the reference current than the IDAC 404. In some implementations, the IDAC 408 and the IDAC 410 are 7-bit DACs. However, as with the IDAC 404, the number of bits supported by the 408 and IDAC 410 may be fewer or greater in number.

The IDAC 410 may receive a proportional to absolute temperature current ($I_{PTAT}$). The $I_{PTAT}$ current may increase in strength as a temperature increases. In other words, as the temperature increases, so may the current corresponding to the $I_{PTAT}$ signal. The IDAC 408 may receive a complementary to absolute temperature current ($I_{CTAT}$). The $I_{CTAT}$ current may decrease in strength as a temperature increases. In other words, as the temperature increases, the current corresponding to the $I_{CTAT}$ signal may decrease.

The $I_{OUT}$ signals of IDAC 408 and IDAC 410 may be combined (e.g., summed) to fine-tune the reference current, which may be referred to as $I_{REF}$, not to be confused with the reference current control value IREF, or IREF<K . . . 1> which controls the IDAC 404. In some cases, the difference between the $I_{OUT}$ signals of IDAC 408 and IDAC 410 set by the difference in control inputs ICT and IPT may be used to set the intercept-temperature drift value.

In some embodiments, the $I_{OUT}$ signals of IDAC 408 and IDAC 410 may each be weighted differently to adjust the reference current value, and consequently, the trim value for adjusting the intercept-temperature drift for the signal-strength detector 200. The weights applied to the $I_{OUT}$ signals of IDAC 408 and IDAC 410 may be controlled by setting or adjusting control bits or control values ICT and IPT, respectively. The ICT control value may control the IDAC 408 to modify a weight of the $I_{CTAT}$ to obtain a weighted $I_{CTAT}$ value. Similarly, the IPT control value may control the IDAC 410 to modify a weight of the $I_{PTAT}$ to obtain a weighted $I_{PTAT}$ value. Modifying the weight of the $I_{CTAT}$ and $I_{PTAT}$ values may modify a ratio of the PTAT current to the CTAT current. Further, the Jour signals of IDAC 408 and IDAC 410 may be combined to obtain a weighted sum of the PTAT and CTAT currents.

In some cases, the ICT and IPT control values may be set such that the resultant signal of the combination of the $I_{OUT}$ signals of IDAC 408 and IDAC 410 is 100% $I_{PTAT}$ and 0% $I_{CTAT}$, or vice versa. Modifying the weights of the $I_{PTAT}$ and $I_{CTAT}$ multiplication may modify $I_{PTCT}$, which in turn may modify the trim or adjustment of the reference current. By adjusting the reference current, the intercept-temperature drift may be modified. A calibration process performed across a set of temperatures set by applying heat from the resistive heater 206 may be used to determine the reference current to apply for the signal-strength detector 200 to select the intercept-temperature drift value. By adjusting the intercept-temperature drift value the VLOG curve of the signal-strength detector 200 can be brought closer to the ideal VLOG curve over a wider temperature range.

Figures 5A, 5B:
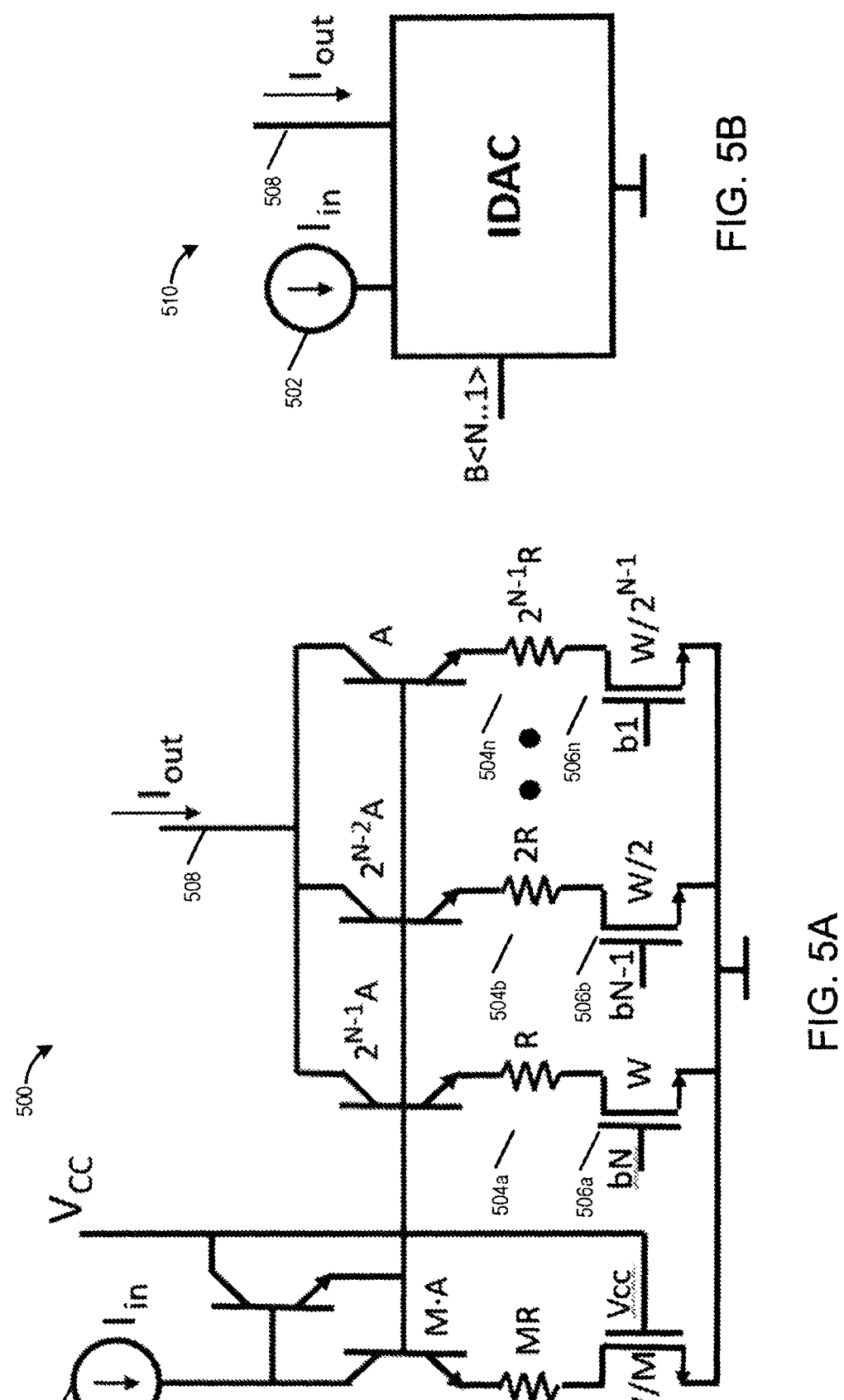
FIG. 5A illustrates a circuit diagram of a multiplying current digital-to-analog converter (IDAC) in accordance with certain embodiments.
FIG. 5B illustrates a block-level circuit symbol for the IDAC of FIG. 5A in accordance with certain embodiments.

FIG. 5A illustrates a circuit diagram of a multiplying current digital-to-analog converter (IDAC) in accordance with certain embodiments. The IDAC 500 is an example implementation of an IDAC that may be used for any of the IDACs described herein (e.g., the IDAC 404, IDAC 408, or IDAC 410). FIG. 5B illustrates a block-level circuit symbol 510 for the IDAC 500 of FIG. 5A in accordance with certain embodiments. As illustrated in FIG. 5A, the IDAC 500 may receive a current $I_{in}$, such as $I_{PTAT}$ or $I_{CTAT}$, at the input 502. This input current may be supplied to a plurality of resistors 504a, 504b, . . . 504n, which may collectively be referred to as resistors 504. Each of the resistors 504 may have a different resistance resulting in a different current. Further, the IDAC 500 may include a set of transistor switches 506a, 506b, . . . 506n, which may collectively be referred to as transistors 506. Each of the transistors 506 may receive a control input, such as an ICT, IPT, or IREF input. Further, each of the transistors 506 may receive a different bit from the control input. Based on the received bit or control input, each of the transistors 506 may be ON or OFF controlling whether a current flows across the corresponding resistor 504. By controlling the transistors 506, and consequently whether current flows across the corresponding resistors 504, the output current output by the output 508 can be controlled, thereby controlling the weight applied to the current received at the input 502. For example, the influence of the current through the resistor 504b with resistance 2R may be half the influence of the current through the resistor 504a with resistance R. Thus, by controlling which transistors 506 are ON, the weight of the current may be adjusted. Further, by having a IDAC 500 for both the $I_{PTAT}$ (e.g., IDAC 410) and the $I_{CTAT}$ (e.g., IDAC 408), it is possible to control the influence of the $I_{PTAT}$ and the $I_{CTAT}$ content on the reference current.

Example Temperature Compensation Circuit

Figure 6:
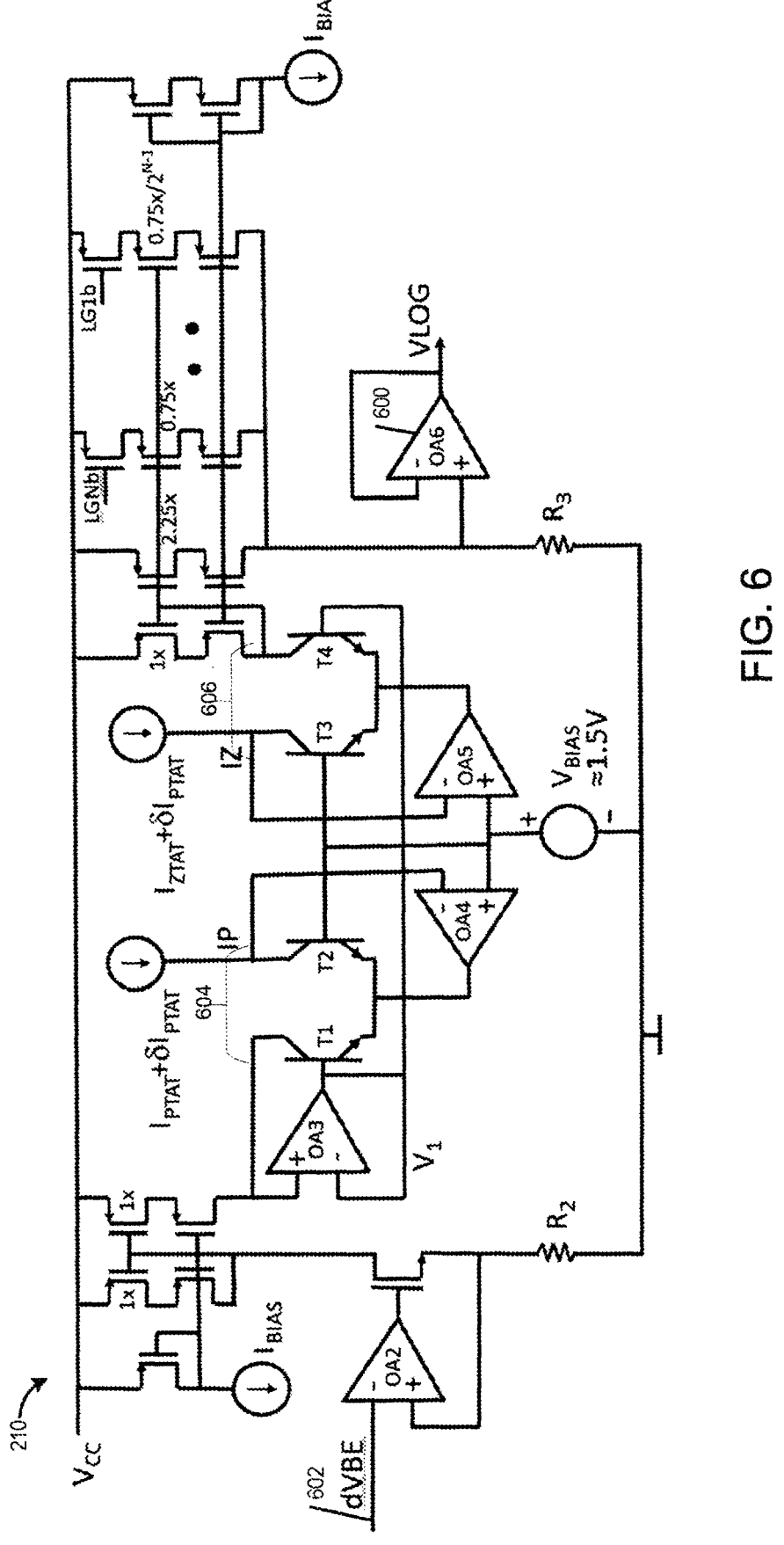
FIG. 6 illustrates a circuit diagram of an output driver of the signal strength detector with a temperature compensation circuit in accordance with certain embodiments.

FIG. 6 illustrates a circuit diagram of an output driver 600 of the signal-strength detector 200 with a temperature compensation circuit 210 in accordance with certain embodiments. As previously described, the analog temperature compensation circuit 210 may be connected in series with the analog signal chain 208. Further, although termed a temperature compensation circuit, the temperature compensation of the signal-strength detector 200 may be achieved by a combination of the analog temperature compensation circuit 210 and the analog signal chain 208. It should be understood that the temperature compensated signal-strength detector 200 may include additional circuitry not illustrated, such as bias control circuitry.

The analog temperature compensation circuit 210 may receive the dVBE signal from the node 312, which may be an output of the analog signal chain 208. The dVBE signal output by the OpAmp 310 at the node 312 may be received at a node 602, which may be an input to the analog temperature compensation circuit 210. The dVBE signal may be a level-shifted voltage. Further, the level-shifted voltage may correspond to a photocurrent generated by a photodiode and input to the signal-strength detector 200.

An attenuated copy of V(Eref–E) plus a constant $V_{PTAT}$ offset may be generated between $V_1$ and $V_{BIAS}$ using OA2-4, R2, T1, T2 and $I_{PTAT}$ with $\delta I_{PTAT}$=0. Differential pair T3 and T4 may be biased at $I_{ZTAT}$ with V ($V_1$–$V_{BIAS}$) input voltage resulting in a 1/T multiplication, providing the temperature compensation of the attenuated V(Eref–E) signal.

To divide out a PTAT value from the received dVBE voltage of the input stage, the analog temperature compensation circuit 210 impresses the current from the input on a first transistor stage 604. The first transistor stage 604 may be formed from the transistors T1 and T2. The first transistor stage 604 may itself be run by a PTAT current.

The voltage generated by the first transistor stage 604 may be impressed upon a second transistor stage 606 formed from a differential transistor pair T3 and T4. The second transistor stage 606 may be biased by a constant current or a zero to absolute temperature (ZTAT) current. When the PTAT and ZTAT currents that bias the first transistor stage 604 and second transistor stage 606 respectively are ideal PTAT and ZTAT currents, the effect of temperature on the signal-strength detector 200 is cancelled out. However, typically mismatches and other manufacturing variations in the signal-strength detector 200 affect the slope-temperature drift of the output voltage, VLOG, output by the output driver 600. The VLOG output by the output driver 600 may represent the signal strength measurement of the received input at the input 202.

To account for the temperature-slope variations due to the non-ideality of the signal-strength detector 200, a trim current or a relatively small current may be added to both the PTAT current that biases the first transistor stage 604 and the ZTAT current that biases the second transistor stage 606. This small current may be referred to as a delta PTAT current or a $\delta I_{PTAT}$. A magnitude of the delta PTAT current and may be a fraction of the magnitude of the PTAT current. For example, the delta PTAT current may be 10% or less than the PTAT current. The addition of the $\delta I_{PTAT}$ to both the PTAT and ZTAT currents may be used to account for slope-temperature variations of the signal-strength detector 200. A PTAT current remains a PTAT current when the delta PTAT current is added to it. However, when adding the delta PTAT current to the ZTAT current, the ZTAT current may become slightly larger with increasing temperature and may increase by, for example, approximately 0.0333% or less per degree Celsius. Similarly, if adding a slight CTAT current to the ZTAT current, the ZTAT current may decrease slightly, for example, by approximately 0.0333% or less per degree Celsius. The combination of the delta PTAT current with the ZTAT current may cause a strength of the current to go down versus temperature. By applying the delta PTAT current to the ZTAT current, the slope of the VLOG can be adjusted bringing the line 104 closer to the ideal VLOG, line 102 over a wider temperature range. In some implementations, instead of the $\delta I_{PTAT}$, a delta constant current, or $\delta I_{ZTAT}$ may be added to both the PTAT and ZTAT currents to account for slope-temperature variations of the signal-strength detector 200.

When operating at temperature $T_0$, which may be room temperature, where the PTAT current is equal to the ZTAT current, little changes when the $\delta I_{PTAT}$ is added because the same current is added to both and the PTAT and ZTAT currents which remain equal and the output value, VLOG, remains constant. Once the temperature deviates from $T_0$, the change in temperature may cause the PTAT current to go up with higher temperatures or down with lower temperatures. When the $\delta I_{PTAT}$, which may be a positive or negative current, is added to the PTAT current, it remains a PTAT current. However, adding the $\delta I_{PTAT}$ current to the ZTAT current gives the effect of adjusting the VLOG slope versus temperature.

The determination of the amount of delta PTAT current to add may use a similar process as the determination of the trim to the reference current that accounts for the intercept-temperature variation. In some cases, the determination of the adjustment for the intercept-temperature drift and the slope-temperature drift may be interrelated and determined using regression analysis for an input current across a set of temperatures by applying a set of slope-temperature drift values and a set of fine-adjustments to the reference current generated to adjust the intercept of the VLOG output.

The digital signals LG1 to LGN (and inverse signals LG1$b$ and LGNb) can control the gain and thus the VLOG slope by using binary weighted current sources, driven by the LG register setting.

Figure 7:
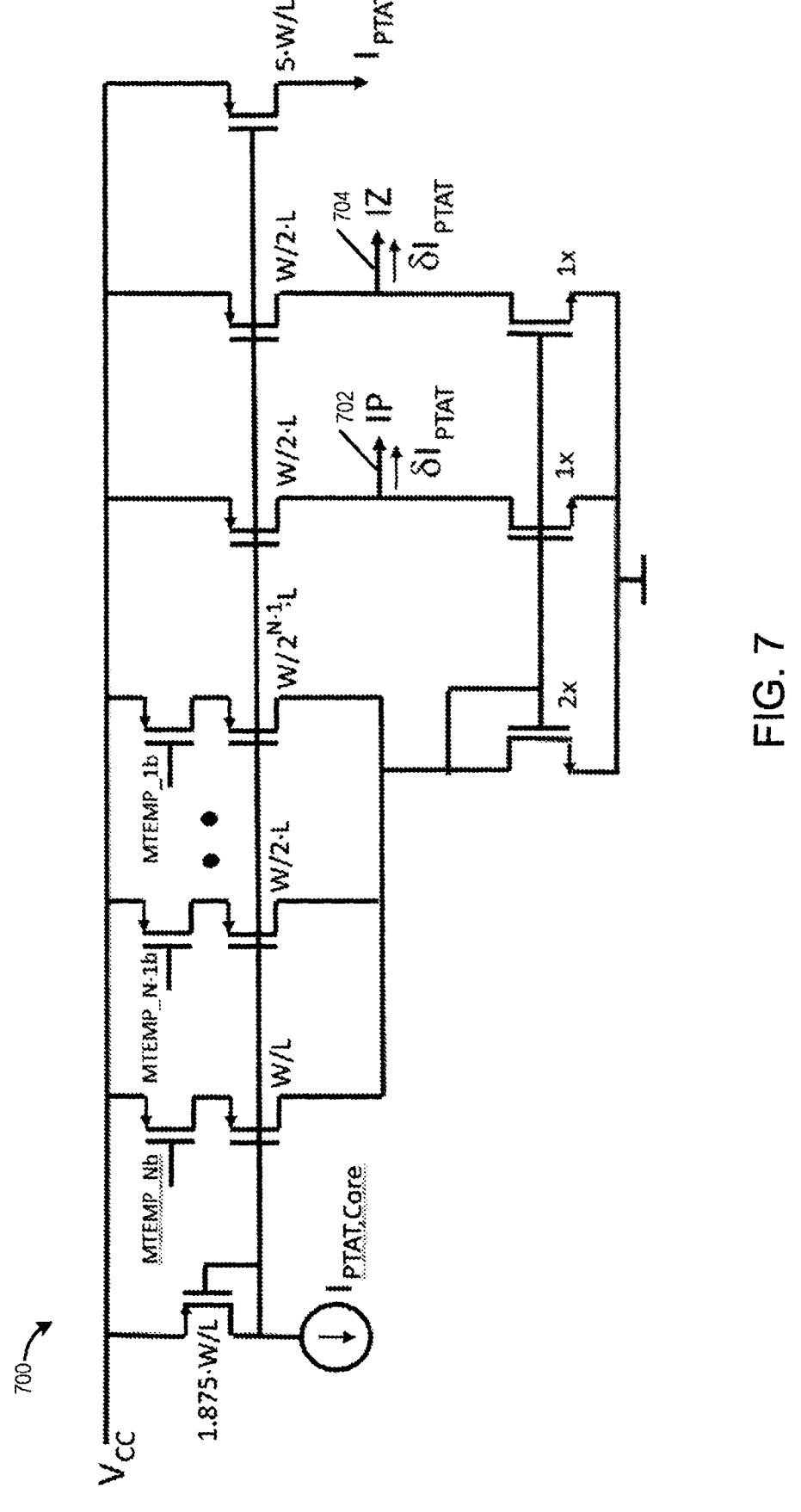
FIG. 7 illustrates a circuit diagram of a delta proportional to absolute temperature (PTAT) current generator in accordance with certain embodiments.

FIG. 7 illustrates a circuit diagram of a delta proportional to absolute temperature (PTAT) current generator 700 in accordance with certain embodiments. The slope-temperature drift can be adjusted by adding a small value $\delta I_{PTAT}$ to both the PTAT bias current of T2 (node 702 or IP in FIGS. 6 and 7) and the ZTAT (Zero-To-Absolute-Temperature) bias current of T3 (node 704 or IZ in FIGS. 6 and 7). The current may be generated by a 6-bit (or other size) current DAC, controlled by a register setting MTEMP or inverted MTEMP_b. The $\delta I_{PTAT}$ can assume both negative and positive current values. A positive $\delta I_{PTAT}$ value may result in a steeper VLOG slope at higher temperatures and vice versa. The $\delta I_{PTAT}$ may have different granularities depending on the selected IDAC. For example, if N=6, the resulting step size may be $\delta = \frac{1}{5} \cdot 2^6 = \frac{1}{320}$.

As previously described, regression analysis may be performed to determine one or more control values for compensating for the effect of temperature of an output of the signal-strength detector 200. The regression analysis may be performed by a processor that can obtain or measure an output of the signal-strength detector 200 based on an input current supplied at the input 202 from, for example, a photodiode, photodetector, or other current generating circuit element. Further, the processor can supply a set of control inputs via the IO pin 212. Alternatively, a user may supply the configuration values directly, or via an interface of a test system that is testing the signal-strength detector 200.

The configuration values may include a set of intercept-temperature drift values and/or a set of slope-temperature drift values. The processor or test system may sweep the intercept-temperature drift values through a set of test values obtaining a VLOG value for each intercept-temperature drift value. Each intercept-temperature drift value may be supplied via the IO pin 212 and/or may be read from the non-volatile memory 216. Further, the VLOG values may be measured for each of a set of intercept-temperature drift values with the resistive heater 206 OFF and again with the resistive heater 206 activated or ON. In some cases, the process may be performed for different levels of heat applied by the resistive heater 206. In cases where multiple temperatures are used, the resistive heater 206 may be initially set to the highest heat setting enabling rapid heating to a highest temperature. After a set period of time, the resistive heater 206 may be set to a lower temperature that provides the same heat as is lost by conduction and convection over the time period and as such, providing a stable elevated temperature vs time. The signal-strength detector 200 may operate around 40 degrees Celsius when the resistive heater 206 is OFF. In some cases, the temperature of the signal-strength detector 200 may be lower. For example, the signal-strength detector 200 may be at 30 degrees Celsius, 35 degrees Celsius, at lower, or at higher temperatures when the resistive heater 206 is OFF. When the resistive heater 206 is ON, the temperature may reach up to 85 degrees Celsius, or higher. Advantageously, by including the resistive heater 206, the signal-strength detector 200 can be tested at room temperature eliminating the need for an oven or hot chuck that can complicate testing and increase the time and cost of testing of the signal-strength detector 200.

Each of the intercept-temperature drift values may be associated with different IPT and ICT values that change the ratio of $I_{PTAT}$ and $I_{CTAT}$ content used to generate the reference current $I_{REF}$. Thus, the VLOG values may be determined for different reference currents that cause a shift in the x-intercept of the VLOG curve (line 104) as illustrated in FIG. 1. The reference current may be swept among a range of reference current values by adjusting the IPT and ICT values among a range of values. By adjusting the reference current among a range of values, the temperature-dependent intercept value for the VLOG can be adjusted.

Similar to the intercept-temperature drift value, the slope-temperature drift of the VLOG curve, the MTEMP values, may be swept through a range of test values. The test system may sweep the slope-temperature drift through each of a set of test values for each intercept-temperature drift test value and for each temperature. Using the determined intercept values for the output VLOG determined for each of the intercept-temperature drift values and slope-temperature drift values at the two or more temperatures, a matrix calculation can be performed. The result of this matric calculation can be used to determine an optimal intercept-temperature drift control value that moves the intercept of the line 104 towards the ideal line 102 over a wider temperature range. These temperature drift control values can be stored within the non-volatile memory 216 and can be used to configure the signal-strength detector 200 by setting the ICT and IPT control values to generate the reference current that minimizes an intercept-temperature drift and/or minimizes a difference between the VLOG x-intercept of the actual VLOG curve (e.g., line 104) and the ideal VLOG curve (e.g., line 102).

The ICT and IPT values that set the desired reference current may be stored as an intercept-temperature drift control value at the non-volatile memory 216. Further, the non-volatile memory 216 may be accessed to determine the intercept-temperature drift control value and the reference current generator 400 may be configured based on the intercept-temperature drift control value during operation of the signal-strength detector 200.

In some cases, the calibrating the signal-strength detector 200 may include determining where a logarithmic slope for a set of MTEMP values with the resistive heater 206 off intersects with a logarithmic slope for a set of MTEMP values with the resistive heater 206 on. The MTEMP value at the point of intersection may correspond to the desired MTEMP value. The MTEMP value may be applied to the current generator 700 to obtain the desired delta PTAT value that moves the slope of the line 104 towards the slope of the ideal line 102 over a wider temperature range.

The MTEMP value may be stored as the slope-temperature drift control value at the non-volatile memory 216. During operation, the signal-strength detector 200 may access the non-volatile memory 216 to determine the slope-temperature drift control value and may use the value to configure the current generator 700 to generate the delta PTAT current.

In some cases, both the logarithmic slope and the x-intercept of the signal-strength detector 200 output, VLOG, may depend on MTEMP. Thus, in some cases, both the x-intercept value and the logarithmic slope can be determined using a single process. In some non-limiting embodiments, the process may include sweeping a set of values corresponding to the slope of the output among a range of values, and for each slope value, sweeping a set of intercepts of the output by modifying the reference current among a range of values. This reference current may be modified by sweeping both the coarse and fine adjustments described herein among a set of values. For each of the intercept and slope configuration values, the input vs output relationships may be determined for a set of input currents. This process may be repeated for a set of slope-temperature drift values and temperatures. Using the result of this process, a matric calculation can be performed to determine the optimal slope-temperature drift and intercept-temperature drift values for the signal-strength detector 200.

An intercept-temperature drift control value that corresponds to the calculated intercept-temperature drift value may be stored as a register value at a register and/or at the non-volatile memory 216. The intercept-temperature drift value may be used to configure the reference current generated by the reference current generator 400 of the analog signal chain 208 to adjust or set the intercept-temperature value during operation of the signal-strength detector 200.

In some implementations, the intercept drift control value may be a pair of values, an IPT register value and an ICT register value. The VLOG intercept-temperature drift may be set by a difference between the IPT and ICT register values, which may control the generated reference current.

A slope-temperature drift control value that corresponds to the calculated slope-temperature drift value may be stored as a register value at a register and/or at the non-volatile memory 216. The slope-temperature drift value may be used to configure the current generator 700 to generate the $\delta I_{PTAT}$ current, which may be used to adjust the slope of the output VLOG versus input to account for the slope-temperature drift during operation of the signal-strength detector 200.

Additional details and embodiments for algorithms that may be used to calibrate the signal-strength detector 200 using an on-chip resistive heater are disclosed in Appendix A of U.S. Provisional Application Nos. 63/486,109 and 63/486,116, which are incorporated by reference above.

Advantageously, the process of calibrating the signal-strength detector 200 may also be used to identify faulty signal strength detectors. For example, if the determined intercept-temperature drift control value that corresponds to adjusting the reference current is outside a certain range, it may be determined that the signal-strength detector 200 is faulty. Similarly, if the slope-temperature drift control value that corresponds to adjusting the delta PTAT for adjusting the slope of the VLOG is outside a certain range, it may be determined that the signal-strength detector 200 is faulty. In some cases, unusual values for the intercept-temperature drift control value and/or the slope-temperature drift control value may identify faulty signal-strength detector 200 that may not be identified through other testing processes.

As described herein, in certain embodiments, intercept-temperature drift calibration and/or slope-temperature drift calibration of a signal strength detector can be achieved. It should be understood that one or both of the intercept-temperature drift calibration and the slope-temperature drift calibration of the signal strength detector can be achieved in the same or in different duty cycles. Moreover, it is possible to combine both the intercept-temperature drift calibration and the slope-temperature drift calibration of the signal strength detector into the same duty cycle by implementing a linear regression or matrix regression method using the embodiments described herein.

Terminology

Conditional language used herein, such as, among others, "can," "could," "might," "may," "e.g.," and the like, unless specifically stated otherwise, or otherwise understood within the context as used, may be generally intended to convey that certain embodiments include, while other embodiments do not include, certain features, elements and/or states. Thus, such conditional language may be not generally intended to imply that features, elements and/or states may be in any way required for one or more embodiments or that one or more embodiments necessarily include these features, elements and/or states.

Conjunctive language such as the phrase "at least one of X, Y, and Z," unless specifically stated otherwise, may be otherwise understood with the context as used in general to convey that an item, term, etc. may be either X, Y, or Z. Thus, such conjunctive language may be not generally intended to imply that certain embodiments require the presence of at least one of X, at least one of Y, and at least one of Z.

While the above detailed description may have shown, described, and pointed out novel features as applied to various embodiments, it may be understood that various omissions, substitutions, and/or changes in the form and details of any particular embodiment may be made without departing from the spirit of the disclosure. As may be recognized, certain embodiments may be embodied within a form that does not provide all of the features and benefits set forth herein, as some features may be used or practiced separately from others.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (for example, not all described acts or events are necessary for the practice of the algorithms). Moreover, in certain embodiments, acts or events can be performed concurrently, for example, through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, for example, a combination of a DSP and a microprocessor, a plurality of microprocessors, one or more microprocessors in conjunction with a DSP core, or any other such configuration. Although described herein primarily with respect to digital technology, a processor may also include primarily analog components. A computing environment can include any type of computer system, including, but not limited to, a computer system based on a microprocessor, a mainframe computer, a digital signal processor, a portable computing device, a device controller, or a computational engine within an appliance, to name a few.

Additionally, features described in connection with one embodiment can be incorporated into another of the disclosed embodiments, even if not expressly discussed herein, and embodiments may have the combination of features still fall within the scope of the disclosure. For example, features described above in connection with one embodiment can be used with a different embodiment described herein and the combination still fall within the scope of the disclosure.

It should be understood that various features and aspects of the disclosed embodiments can be combined with, or substituted for, one another in order to form varying modes of the embodiments of the disclosure. Thus, it may be intended that the scope of the disclosure herein should not be limited by the particular embodiments described above. Accordingly, unless otherwise stated, or unless clearly incompatible, each embodiment of this disclosure may comprise, additional to its essential features described herein, one or more features as described herein from each other embodiment disclosed herein.

Features, materials, characteristics, or groups described in conjunction with a particular aspect, embodiment, or example may be to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps may be mutually exclusive. The protection may be not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

Moreover, while operations may be depicted in the drawings or described in the specification in a particular order, such operations need not be performed in the particular order shown or in sequential order, or that all operations be performed, to achieve desirable results. Other operations that may be not depicted or described can be incorporated in the example methods and processes. For example, one or more additional operations can be performed before, after, simultaneously, or between any of the described operations. Further, the operations may be rearranged or reordered in other implementations, including being performed at least partially in parallel. Those skilled in the art will appreciate that in some embodiments, the actual steps taken in the processes illustrated and/or disclosed may differ from those shown in the figures. Depending on the embodiment, certain of the steps described above may be removed, others may be added.

For purposes of this disclosure, certain aspects, advantages, and novel features may be described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that may be within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, 0.1 degree, or otherwise.

The scope of the present disclosure may be not intended to be limited by the specific disclosures of preferred embodiments in this section or elsewhere in this specification, and may be defined by claims as presented in this section or elsewhere in this specification or as presented in the future. The language of the claims may be to be interpreted broadly based on the language employed in the claims and not limited to the examples described in the present specification or during the prosecution of the application, which examples may be to be construed as non-exclusive.

Unless the context clearly may require otherwise, throughout the description and the claims, the words "comprise", "comprising", and the like, may be construed in an inclusive sense as opposed to an exclusive or exhaustive sense, that may be to say, in the sense of "including, but not limited to".

What is claimed is:

1. A signal-strength detector comprising:
an intercept-temperature drift input to receive an intercept-temperature drift value;
a reference current generator that generates a reference current based at least in part on the intercept-temperature drift value, wherein the reference current generator generates the reference current as a weighted sum of a proportional to absolute temperature (PTAT) current and a complementary to absolute temperature (CTAT) current; and
an analog signal chain that adjusts an intercept-temperature drift of the signal-strength detector based at least in part on the reference current.

2. The signal-strength detector of claim 1, wherein the reference current includes a trim value determined based at least in part on the intercept-temperature drift value, wherein inclusion of the trim value with the reference current causes adjustment of the intercept-temperature drift of the signal-strength detector.

3. The signal-strength detector of claim 1, wherein adjusting a ratio of the PTAT current to the CTAT current adjusts the intercept-temperature drift of the signal-strength detector.

4. The signal-strength detector of claim 1, wherein the analog signal chain includes the reference current generator.

5. The signal-strength detector of claim 1, wherein the reference current generator comprises a first current digital to analog converter (IDAC) configured to weight the PTAT current and a second IDAC configured to weight the CTAT current.

6. The signal-strength detector of claim 5, wherein a sum of the weighted PTAT current and the weighted CTAT current provides a fine adjustment of the reference current, and wherein the reference current generator further comprises a third IDAC that provides a coarse adjustment of the reference current.

7. The signal-strength detector of claim 1, further comprising a resistive heater configured to apply heat to the analog signal chain.

8. The signal-strength detector of claim 7, wherein the resistive heater is configured to support an OFF state and a plurality of ON states, wherein each ON state of the plurality of ON states causes a different amount of heat to be applied to the analog signal chain.

9. The signal-strength detector of claim 7, wherein the intercept-temperature drift value is determined based at least in part on a plurality of output values of the signal-strength detector obtained for an input current at a plurality of temperature values and a plurality of reference current values.

10. The signal-strength detector of claim 9, wherein the resistive heater applies different amounts of heat to the analog signal chain to obtain the plurality of temperature values.

11. The signal-strength detector of claim 9, wherein the intercept-temperature drift value is determined using regression analysis on the plurality of output values of the signal-strength detector obtained for the input current at the plurality of temperature values and the plurality of reference current values.

12. The signal-strength detector of claim 1, further comprising a non-volatile memory configured to store the intercept-temperature drift value, and wherein the reference current generator accesses the intercept-temperature drift value from the non-volatile memory.

13. The signal-strength detector of claim 1, further comprising an interface circuit configured to receive the intercept-temperature drift value from the intercept-temperature drift input and to store the intercept-temperature drift value at a non-volatile memory.

14. The signal-strength detector of claim 1, further comprising an analog temperature compensation circuit that adjusts a slope-temperature drift of the signal-strength detector by at least adding the PTAT current to a zero to absolute temperature (ZTAT) current.

15. The signal-strength detector of claim 14, wherein the analog temperature compensation circuit is connected in series with the analog signal chain, and wherein the analog temperature compensation circuit generates an output of the signal-strength detector corresponding to a measured signal strength of an input signal.

16. The signal-strength detector of claim 14, wherein the PTAT current is a trim current that is added to the ZTAT current and to a second PTAT current.

17. The signal-strength detector of claim 14, wherein the PTAT current is determined using regression analysis on a plurality of slope-temperature drift values at a plurality of temperatures applied by a resistive heater of the signal-strength detector.

18. A photocurrent detection system comprising:
a photocurrent detector configured to receive a photocurrent output by a photodiode; and
a signal-strength detector configured to measure a signal strength of the photocurrent output, wherein the signal-strength detector comprises:
an intercept-temperature drift input to receive an intercept-temperature drift value;
a reference current generator that generates a reference current based at least in part on the intercept-temperature drift value; and
an analog signal chain that adjusts an intercept-temperature drift of the signal-strength detector based at least in part on the reference current.

19. A method of calibrating a signal-strength detector, the method comprising:
causing a resistive heater of the signal-strength detector to be in an OFF state;
for an input current value corresponding to a photocurrent of a photodetector and when the resistive heater is in the OFF state, sweeping a slope-temperature drift of an output value of the signal-strength detector generated based on the input current value among a range of slope-temperature drift values; and
for each slope-temperature drift value of the range of slope-temperature drift values, sweeping a reference current value among a range of reference current values to obtain a first set of intercept values;
causing the resistive heater to be in an ON state, wherein the resistive heater heats at least an analog signal chain of the signal-strength detector when in the ON state;
for the input current value corresponding to the photocurrent of the photodetector and when the resistive heater is in the ON state,
sweeping the slope-temperature drift of the output value of the signal-strength detector generated based on the input current value among the range of slope-temperature drift values; and
for each slope-temperature drift value of the range of slope-temperature drift values, sweeping the reference current value among the range of reference current values to obtain a second set of intercept values;
using the first set of intercept values and the second set of intercept values, performing linear regression to determine an intercept-temperature drift control value that minimizes intercept-temperature drift of the signal-strength detector; and
configuring a register value of the signal-strength detector with the intercept-temperature drift control value, wherein the signal-strength detector sets the reference current value based at least in part on the intercept-temperature drift control value during operation.

\* \* \* \* \*